United States Patent [19]

Baird

[11] Patent Number: 4,996,170
[45] Date of Patent: Feb. 26, 1991

[54] MOLDING PROCESS FOR ENCAPSULATING SEMICONDUCTOR DEVICES USING A THIXOTROPIC COMPOUND

[75] Inventor: John Baird, Scottsdale, Ariz.
[73] Assignee: Motorola, Inc., Schaumburg, Ill.
[21] Appl. No.: 559,922
[22] Filed: Jul. 30, 1990
[51] Int. Cl.$^5$ .................. H01L 21/56; H01L 23/28
[52] U.S. Cl. .................. 437/219; 174/52.5; 264/272.17
[58] Field of Search ........... 437/219, 212, 207, 211; 174/52.5; 264/272.17

[56] References Cited

U.S. PATENT DOCUMENTS

| | | | |
|---|---|---|---|
| 3,653,959 | 4/1972 | Kehr et al. | 174/52.2 |
| 3,751,724 | 8/1973 | McGrath et al. | 437/207 |
| 4,012,766 | 3/1977 | Phillips et al. | 437/209 |
| 4,327,369 | 4/1982 | Kaplan | 437/211 |
| 4,460,537 | 7/1984 | Heinle | 437/207 |
| 4,554,126 | 11/1985 | Sera | 437/212 |
| 4,784,872 | 11/1988 | Moeller et al. | 437/225 |
| 4,889,960 | 12/1989 | Butt | 174/52.4 |

*Primary Examiner*—Olik Chaudhuri
*Assistant Examiner*—David E. Graybill
*Attorney, Agent, or Firm*—Joe E. Barbee; Miriam Jackson

[57] ABSTRACT

An improved molding process utilizes a thixotropic compound. The thixotropic compound is transferred from a feed pot to a manifold having at least one outlet. The manifold is held at a temperature in which the thixotropic compound is not cured. The manifold is engaged with a mold that has an inlet opening that runs to a mold cavity, such that the outlet of the manifold and the inlet of the mold communicate with each other. The thixotropic compound is transferred from the manifold into the mold cavity, which is held at a temperature at which the thixotropic compound is cured. The manifold and the mold are then separated, drawing the thixotropic compound near the exit of the feed runners into the manifold, thus making a clean separation.

7 Claims, 1 Drawing Sheet

MOLDING PROCESS FOR ENCAPSULATING SEMICONDUCTOR DEVICES USING A THIXOTROPIC COMPOUND

BACKGROUND OF THE INVENTION

This invention relates, in general, to molding processes, and more particularly, to a molding process in which a thixotropic compound is used for encapsulating semiconductor devices.

In the past, semiconductor devices were encapsulated using a transfer molded filled epoxy compound or solid thermoset. This solid thermoset is a solid at room temperature and is input to the process in the form of pellets or tablets made by compacting a coarse granule. The granules must be stored in a cold storage before use. In addition, the pellets must be metered to match different sizes of molding apparatus. The volumetric controls required using this epoxy compound are not only time consuming, but add no value to the process, thus are very disadvantageous.

The molding process of the prior art is carried out as follows: a piston or ram, acting within a cylinder, called a pot, plasticizes pellets of solid thermoset, forcing the solid thermoset into distribution runners of a mold. The compound must also be preheated. The solid thermoset flows in the distribution runners where it is fluidized by shear flow through subrunners and gates to mold cavities. In the cavities, the now liquid thermoset is warmed to mold temperature where it cures to form a rigid solid. One disadvantage of this process is that the transfer cylinder or pot and the transfer ram operate at the high mold temperatures. Thus, a cured cull remains in the pot and sprue remains in the distribution runners and subrunners, which constitutes a substantial waste of the solid thermoset. A specific amount of solid thermoset must be placed into the pot so that a cull remains, otherwise, air may enter the mold cavity. Because the solid thermoset is exposed to the environment before injection into the mold, particulates and water may contaminate the solid thermoset, diminishing the quality of the molded compound.

By now it should be appreciated that it would be advantageous to provide an improved molding process.

Accordingly, it is an object of the present invention to provide an improved molding process utilizing a thixotropic liquid thermoset compound.

Another object of the present invention is to provide an improved molding process for encapsulating semiconductor devices.

A further object of the present invention is to provide a molding process that reduces the amount of waste.

An additional object of the present invention is to provide a molding process that increases the efficiency of transfer molding.

Yet another object of the present invention is to provide a molding apparatus that improves product quality.

Still another object of the present invention is to provide a molding process that does not require volumetric controls.

SUMMARY OF THE INVENTION

In accordance with the present invention, the above and other objects and advantages are provided by a molding process utilizing a thixotropic liquid thermoset compound. The thixotropic liquid thermoset compound is transferred from a feed pot into a manifold by hydraulic means. The manifold has at least one feed runner having an opening for expelling the thixotropic liquid thermoset compound therethrough. The manifold is held at a temperature at which the thixotropic liquid thermoset compound is not cured. The manifold is engaged with a mold having at least one mold cavity, and having a subrunner that runs from the mold cavity to the exterior of the mold, such that the feed runner communicates with the subrunner. The thixotropic compound is transferred from the manifold through the subrunner and into the mold cavity, which is held at a temperature at which the thixotropic liquid thermoset compound is cured. The manifold and the mold are then separated, drawing the thixotropic liquid thermoset compound near the exit of the feed runners into the manifold, thus making a clean separation. Because the thixotropic liquid thermoset compound in the manifold is not cured, no cull is produced.

DETAILED DESCRIPTION OF THE DRAWINGS

Figure 1:
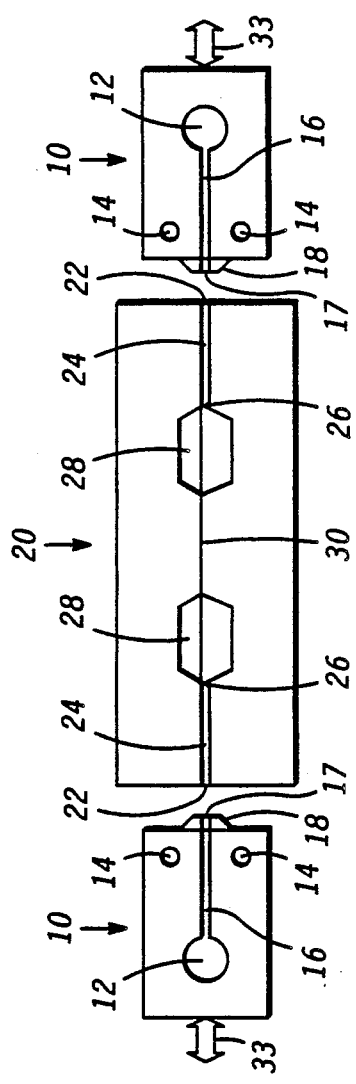
FIG. 1 illustrates a side view of a portion of the molding apparatus of the present invention.

FIG. 1 illustrates side view of a portion of the molding apparatus used to carry out the present invention. What is shown is a manifold 10, which is used to transfer a molding compound (not shown), a thixotropic liquid thermoset compound, to a mold 20. Liquid thermosets are similar to solid thermosets used in the prior art, except that the liquid thermoset is a liquid, not a solid, at room temperature. Liquid polyester or liquid epoxy thermosetting compounds can be obtained from companies such as Thermoset Plastics, Inc., or Hitachi Chemical. Releases, waxes that are soluble in the liquid compound, may have to be added to the epoxy compounds to prevent the cured compound from sticking to mold cavity 28. The thixotropic liquid thermoset compound will be referred to as a thixotropic compound hereinafter.

Manifold 10 is comprised of a feed duct 12, having at least one opening to the exterior of manifold 10, through which the thixotropic compound is brought in. At least one feed runner 16 runs from feed duct 12 to an opening 17 at the exterior of manifold 10. In a preferred embodiment, a raised seal 18 surrounds opening 17. Raised seal 18 could alternatively be located on mold 20. Raised seal 18 provides for less contact area between manifold 10 and mold 20. This results in less heat transfer from mold 20 to manifold 10, which results in less chance of curing the thixotropic compound in manifold 10. In addition, less force is required to keep a seal between manifold 10 and mold 20 at pressure, so that no leaks are present during injection of the thixotropic compound. Manifold 10 also has a means for keeping the thixotropic compound at at least approximately room temperature to prevent curing of the thixotropic compound. In one example, a coolant, such as chill water, may be circulated through manifold 10 through a coolant line 14 near seal 18 to maintain seal 18 at room temperature. Because manifold 10 is held at room temperature, degradation of seal 18 is minimized. Other means to keep manifold 10 at room temperature may be used.

FIG. 1 illustrates a mold 20 having a two strip chase, each chase having at least one cavity 28. Manifold 10 is provided at each end of mold 20 shown. Mold 20 is comprised of at least one mold cavity 28, and from each cavity 28 runs a subrunner 24, having an opening 22 and a gate 26 adjacent to cavity 28. Many variations are possible. For example, a plurality of subrunners 24 each running to a cavity 28 may be disposed in mold 20 to communicate with feed runners 16 from manifold 10, or a plurality of subrunners 24 each running to a cavity 28 may run from one distribution runner (not shown) so that the distribution runner or a plurality of distribution runners communicate with feed runners 16. Mold 20 is comprised of two halves, shown by parting plane 30. Mold 20 is kept at a temperature at which the thixotropic compound cures. This is accomplished by well known conventional methods.

A means of bringing manifold 10 into contact with mold 20 may consist of, for example, any physical means, illustrated simply by arrows 33 in FIG. 1. Precision location of manifold 10 to mold 20 is not required, because feed runner 16 does not have to be in perfect alignment with subrunner 24 for injection to take place. In addition, the size of feed runners 16 and subrunners 24 may be designed in order to provide wide tolerances.

By utilizing a thixotropic compound, instead of a solid thermoset, no preheating is required, no pelletizing or metering is required, and no bulk cold storage is required. Thus, because the volumetric and other controls required in the prior art are not necessary, efficiency and productivity are increased.

Figure 2:
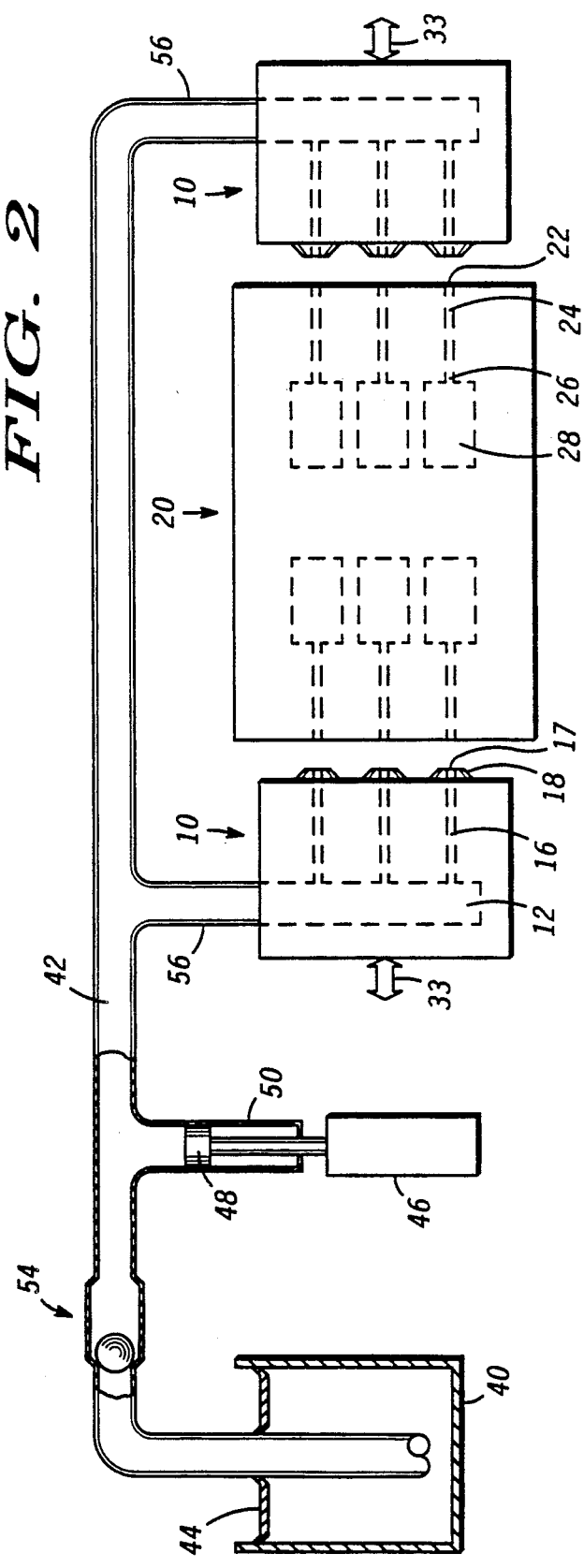
FIG. 2 illustrates a schematic of the molding apparatus of the present invention.

FIG. 2 illustrates a schematic of an embodiment of molding apparatus used to carry out the present invention. Manifold 10 and mold 20 are shown from a top view. Coolant lines 14 are not shown in FIG. 2 for convenience. As an example, manifold 10 is shown to have three feed runners 16, each having an opening 17 and a seal 18. Mold 20 is thus shown to have a complementary amount of subrunners 24 to communicate with each feed runner 16. A feed pot 40, which may be the shipping container in which the thixotropic compound (not shown) is received and mixed, is used to input the thixotropic compound. A feed tube 42 is placed in feed pot 40. In a preferred embodiment, feed tube 42 has a follower plate 44 in order to prevent exposure of the thixotropic compound to the environment. Thus, air carried contaminates, especially water, cannot contaminate the thixotropic compound.

A typical mold cycle used to encapsulate a semiconductor device (not shown), for example, would progress as follows: mold 20 is closed at parting plane 30 (see FIG. 1) and brought into full clamp force. This may be accomplished by standard means well known in the art. Manifold 10 is brought into full contact force with mold 20 by any suitable means, such as by hydraulic means. During this time openings 17 of manifold 10 are closed. The thixotropic compound is drawn out from feed pot 40 through feed tube 42 and subfeed tubes 56 to feed duct 12 and to feed runners 16 by a transfer piston 48 positioned in a transfer cylinder 50. Transfer piston 48 is driven by a hydraulic cylinder 46; however, any other suitable means may be used. A check valve 54 is positioned close to feed pot 40 and acts to prevent thixotropic compound flow back into feed pot 40 when transfer piston 48 acts to inject the thixotropic compound into mold 20. Check valve 54 is only illustrated very simply.

After manifold 10 is filled, it is brought to full injection pressure by further action of transfer piston 48. Openings 17 of manifold 10 allow the thixotropic compound to flow into openings 22 through subrunners 24 until each mold cavity 28 is full. Within a few seconds after injection is complete, gates 26 will be frozen or cured. Mold cavities 28, in this embodiment, are filled at approximately the same time. Hydraulic transfer piston 48 is then retracted (not shown to be retracted in FIG. 2) drawing thixotropic compound from feed pot 40 to refill transfer cylinder 50. When hydraulic piston 48 is near its retracted stop, manifold 10 is separated from mold 20. Subfeed tubes 56 must be flexible enough to allow for small movement of manifold 10 on one axis. Thixotropic compound near manifold seals 18 is drawn into manifold 10 as manifold 10 is separated from mold 20, making a clean separation.

Injection of the thixotropic compound is shown to be at parting plane 30, however, injection may take place elsewhere. The present invention is applicable to mold apparatus using multiple or single points of injection. One of the advantages, however, is the ability to use multiple points of injection with efficiency and without producing a minimal amount of cured waste. Manifold 10 will only be in contact with mold 20 for a few seconds during thixotropic compound injection and while transfer cylinder 50 is refilled. Thus, the thixotropic compound in manifold 10 remains at room temperature at all times and is never cured. Thus, this process does not form the cull that was formed in the pot of the prior art. Cured product, in this example an encapsulated semiconductor device, is removed from mold 20 and the cycle is repeated. Sprue remaining in subrunners 24 is also removed. The amount of cured waste is substantially lower than that produced using prior art processes. In this manner, continuous cycling, without the need for purging manifold seal 18, can be accomplished.

Alternate means are available to enable continuous molding cycles without advancing the cure of the thixotropic compound near seals 18 of manifold 10. One such means comprises placing check valves (not shown) near manifold 10 which allow transfer cylinder 50 to be filled while manifold 10 is separated from mold 20. This would minimize the time that manifold 10 and mold 20 are in contact.

By now it should be appreciated that there has been provided an improved molding process utilizing a thixotropic compound. A plurality of mold cavities may be filled, without cull waste. Efficiency and productivity is improved because the thixotropic compound does not require the need for stringent volumetric controls and handling.

I claim:
1. A molding process for encapsulating semiconductor devices, comprising the steps of:
   providing a manifold in which a thixotropic compound is disposed, the manifold having at least one feed runner for expelling the thixotropic compound therethrough wherein the feed runner is closed;
   providing a mold having at least one mold cavity, and having a subrunner extend from each mold cavity to the exterior of the mold placing a semiconductor device in each mold cavity and closing the mold;
   transferring the thixotropic compound from a feed pot to the manifold, and into each feed runner;
   holding the manifold at a temperature in which the thixotropic compound is not cured;

holding the mold at a temperature at which the thixotropic compound is cured;

engaging the manifold with the mold, such that each feed runner communicates with each subrunner;

opening each feed runner of the manifold;

transferring the thixotropic compound from the manifold to the mold through each feed runner of the manifold to each subrunner of the mold and into the mold cavity; and separating the manifold and the mold, drawing the thixotropic compound near the exit of each feed runner into the manifold, thus making a clean separation.

2. The molding process of claim 1 wherein the manifold is held at a temperature at which the thixotropic compound is not cured by a coolant running through coolant lines in the manifold.

3. The molding process of claim 1 wherein transferring the thixotropic compound from the feed pot to the manifold and from the manifold to the mold is accomplished by hydraulic means.

4. The molding process of claim 1 wherein the process is continuous, such that purging of the manifold is not required.

5. The molding process of claim 1 wherein the mold is comprised of a plurality of mold cavities, each having a subrunner extending therefrom, and wherein the manifold has a plurality of feed runners to communicate with each subrunner.

6. The molding process of claim 5 wherein the plurality of mold cavities are filled at approximately the same time.

7. A molding process for encapsulating semiconductor devices, comprising the steps of:

providing a manifold in which a thixotropic compound is disposed, the manifold having at least one feed runner for expelling the thixotropic compound therethrough wherein the feed runner is closed;

providing a mold having at least one mold cavity, and having a subrunner extend from each mold cavity to the exterior of the mold;

transferring the thixotropic compound from a feed pot to the manifold, and into each feed runner by the action of a piston;

holding the manifold at a temperature in which the thixotropic compound is not cured;

placing a semiconductor device in each mold cavity and closing the mold;

holding the mold at a temperature at which the thixotropic compound is cured;

engaging the manifold with the mold, such that each feed runner communicates with each subrunner;

opening each feed runner of the manifold;

transferring the thixotropic compound from the manifold to the mold through each feed runner of the manifold to each subrunner of the mold and into the mold cavity by further action of the piston;

separating the manifold and the mold, drawing the thixotropic compound near the exit of each feed runner into the manifold, thus making a clean separation; and removing the encapsulated semiconductor device from each mold cavity and any sprue remaining in each subrunner.

* * * * *